(12) United States Patent
Ishitsuka et al.

(10) Patent No.: US 6,326,255 B1
(45) Date of Patent: Dec. 4, 2001

(54) SEMICONDUCTOR DEVICE (75) Inventors: Norio Ishitsuka, Ibaraki-ken; Hideo Miura, Koshigaya; Shuji Ikeda, Koganei; Yasuko Yoshida, Sayama; Norio Suzuki, Mito; Michimasa Funabashi, Hachioji, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/675,053

(22) Filed: Sep. 29, 2000

Related U.S. Application Data (62) Division of application No. 09/434,308, filed on Nov. 5, 1999.

(30) Foreign Application Priority Data

Nov. 9, 1998 (JP) .................................................. 10-317777

(51) Int. Cl.$^7$ ........................... H01L 21/26; H01L 29/94; H01L 29/00
(52) U.S. Cl. .......................... 438/218; 438/425; 438/978; 257/374; 257/510
(58) Field of Search .................................... 438/218, 424, 438/425, 445, 978; 257/374, 506

(56) References Cited

U.S. PATENT DOCUMENTS

| | | | |
|---|---|---|---|
| 5,863,827 | * 1/1999 | Joyner | 438/425 |
| 5,956,598 | * 9/1999 | Huang et al. | 438/424 |
| 6,057,241 | * 5/2000 | Matsuda et al. | 438/689 |
| 6,090,684 | * 7/2000 | Ishitsuka et al. | 438/424 |
| 6,909,684 | * 7/2000 | Ishitsuka et al. | 438/424 |

* cited by examiner

Primary Examiner—Richard Elms
Assistant Examiner—Adam Pyonin
(74) Attorney, Agent, or Firm—Antonelli, Terry, Stout & Kraus, LLP (57) ABSTRACT

A method for manufacturing a semiconductor device includes the steps of (1) forming a pad oxide film of 5 nm or more on a circuit forming surface of a semiconductor substrate; (2) forming an oxidation inhibition film on the pad oxide film; (3) forming grooves of a given depth with the oxidation inhibition film as a mask; (4) receding the pad oxide film; (5) oxidizing the grooves formed on the semiconductor substrate in the range of $0<C\leq 0.88t-924$ in which the oxidizing atmosphere is dry oxidation ($H2/O2\approx 0$), the oxygen partial pressure in the air corresponding to the oxygen partial pressure ratio is C %, and the oxidizing temperature is t (° C.); (6) burying an insulating film inside of the oxidized groove; (7) removing the buried insulating film formed on the oxidation inhibition film; (8) removing the oxidation inhibition film formed on a circuit forming surface of the semiconductor substrate; and (9) removing the pad oxide film formed on the circuit forming surface of said semiconductor substrate.

3 Claims, 5 Drawing Sheets

SEMICONDUCTOR DEVICE

This application is a Divisional application of prior application Ser. No. 09/434,308, filed Nov. 5, 1999.

BACKGROUND OF THE INVENTION

The present invention relates to a method of manufacturing a semiconductor device having a highly reliable groove isolation structure and a semiconductor device manufactured by the method.

An SGI (Shallow Groove Isolation) structure is one of the typical structures for electrically insulating adjacent elements such as transistors on a semiconductor substrate. This SGI structure is formed as follows At first, a pad oxide film and an oxidation inhibition film are formed ona silicon substrate. Then, a shallow groove is also formed on an insulating portion of the silicon substrate. Next, the oxide film is coated on the shallow groove by means of thermal oxidation and then an insulating film is coated on the oxide film.

The SGI structure is suitable for the device of 0.25 μm process or smaller, because it has a higher precision in working dimension than the conventionally-used LOCOS structure.

However, this SGI structure has a problem that a silicon shape on an upper end of the groove may become acute in the thermal oxidation If the acute portion is left on the surface of the substrate, for example, as published by A. Bryant et al. in "Technical Digest of IEDM '94, pages 671 to 674, an electric field is concentrated on this acute portion while the circuit is in operation, so that the withstand characteristics of the transistors or the capacitors composing the circuit may be degraded.

It is experientially known that the degrade of the withstand characteristics takes place in the case that the curvature radius of the substrate around the upper end of the groove is 3 nm or lower even if the angle of the substrate around the upper end of the groove is 90 degrees or more. In order to solve these problems, as indicated in JP-A-2-260660, it is possible to form the pad oxide film on a lower portion so as to recede from the upper end of the groove by 0.1 μm and perform the oxidation with a gas containing vapor at a temperature of around 1000° C., for forming a curvature on the upper end of the groove.

As indicated in JP-A-6-21214, after forming a groove on the silicon substrate, amorphous silicon or epitaxial silicon is deposited to have a thickness of 5 nm or more. Then, the coat is oxidized at a temperature of 1100 to 1150° C. and in the atmosphere of oxygen whose pressure is lowered by 20%. This is the indicated method of forming a curvature on the upper end of the groove.

In this method of depositing amorphous silicon, on the upper end of the groove, the amorphous silicon film is made thinner than the tabular portion of the substrate. Hence, the oxidation in this state preferentially makes the corner oxidized, so that the corner of the silicon substrate is made round.

Moreover, if the method of depositing the epitaxial silicon film is executed after forming the groove, as a result, the corner is chamfered so that the shape after oxidation is made round.

SUMMARY OF THE INVENTION

However, if the semiconductor is produced by the conventional method disclosed in JP-A-2-260660, since the receded amount of the pad oxide film is 0.1 μm, stepped portion may be generated around the upper end of the groove on the silicon substrate. Further, if the oxidation is large in this method, the curvature is formed when the stepped portion is formed, while if the oxidation is small, especially, about 10 nm, the portion around the upper end of the groove may be acute.

When forming a gate oxide film on such a stepped portion and an acute portion, the thickness of the oxide film is made uneven, on which film electric weak spots are formed. Moreover, since it is more likely that the stress is concentrated on these portions, the electric reliability of the transistors on the stepped portions may be made lower.

According to the method of depositing amorphous silicon after forming the groove as disclosed in the prior art of JP-A-6-21214, the amorphous silicon film may have the same thickness as the tabular portion even at the corner of the upper end of the groove, which may often make it difficult to round the corner.

Further, in the method of growing the epitaxial silicon film, the shape of the corner may not be chambered in the actual layout.

It is an object of the present invention to provide a method of manufacturing a semiconductor device and a semiconductor device manufactured by the method which make it possible to reliably form a curvature on the upper end of the groove without forming the foregoing stepped portions and even in the case of the small oxidation (about 10 nm).

The object is achieved by the following method:

(A) A method of manufacturing a semiconductor device includes the steps of (1) forming a pad oxide film of 5 nm or more on a circuit forming surface of a semicnductor substrate; (2) forming an oxidation inhibition film on the pad oxide film; (3) forming a groove of a given depth with the oxidation inhibition film as a mask; (4) receding the pad oxide film; (5) oxidizing a groove portion formed on the semiconductor substrate in the range of $0<C\leq0.88t-924$ in which the oxidation atmosphere is in the dry oxidizing state (H2/O2≈0) and the oxygen partial pressure ratio, that is, the partial pressure of oxygen is C %, and the oxidation temperature is t (° C.); (6) burying an insulating film in the oxidized groove; (7) removing the buried insulating film formed on the oxidation inhibition film; (8) removing the oxidation inhibition film formed on the circuit forming surface of the semiconductor substrate; and (9) removing the pad oxide film formed on the circuit forming surface of the semiconductor substrate.

(B) Preferably, in the foregoing item (A), at the step (6) of receding the pad oxide film, the pad oxide film is receded from the upper end of the groove of the semiconductor substrate by the range of 10±5 nm.

(C) A semiconductor device is manufactured by the process of forming a pad oxide film of 5 nm or more on a circuit forming surface of a semiconductor substrate; forming an oxidation inhibition film on the pad oxide film; forming a groove of a given depth with the oxidation inhibition film as a mask; receding the pad oxide film; oxidizing a groove portion formed on the semiconductor substrate in the range of $0<C\leq0.88t-924$ in which the oxidation atmosphere is in the dry oxidizing state (H2/O2≈0) and the oxygen partial pressure ratio, that is, the partial pressure of oxygen is C %, and the oxidation temperature is t (° C.); burying an insulating film in the oxidized groove; removing the buried insulating film formed on the oxidation inhibition film; removing the oxidation inhibition film formed on the circuit forming surface of the semiconductor substrate; and removing the pad oxide film formed on the circuit forming surface of the semiconductor substrate.

(D) Preferably, in the foregoing item (C), the recession of the pad oxide film is defined in the range of 10±5 nm from the upper end of the groove of the semiconductor substrate.

If the groove portion is oxidized in the range of $0 < C \leq 0.88t - 924$ in which the oxygen partial pressure is C % and the oxidizing temperature is t (° C.), the curvature radius of the corner is 3 nm or more, which does not bring about any defect.

Since the oxygen partial pressure ratio C is 0 or more, no oxidation is done. Hence, the oxidizing temperature is in the range of $C \leq 0.88t - 924$ to 1050° C. or more.

DESCRIPTION OF THE EMBODIMENTS

Hereafter, the description will be oriented to the embodiments of the present invention with reference to the appended drawings.

The method of manufacturing a semiconductor device according to a first embodiment of the invention will be described along FIGS. 1 and 2.

FIG. 1 shows a sectional structure at each processing step of the semiconductor device manufactured by the manufacturing method according to the first embodiment of the invention. FIG. 2 is a flowchart roughly illustrating the manufacturing process. Later, the steps (1) to (10) of the manufacturing process will be described with reference to FIG. 1 along the flowchart of FIG. 2.

(1) The process is executed to thermally oxidize the surface of a silicon substrate 1 for forming a pad oxide film 2 having a thickness of 5 nm or more, preferably, about 10 nm. (Refer to processes (101) and (102) in FIG. 2 and FIG. 1A.)

(2) The process is executed to deposit a silicon nitride film 12 having a thickness of about 200 nm. This silicon nitride film 12 is served as an oxidation inhibition film for forming an element isolation thermal oxide film 5. (Refer to process (103) in FIG. 2.)

(3) A photoresist 13 is formed on the silicon nitride film 12. (Refer to process (104) in FIG. 2 and FIG. 1B.)

(4) The proper portions of the photoresist 13 are removed by using the ordinary exposure method. Then, the silicon nitride film 12 and the pad oxide film 2 are removed. (Refer to processes (105) and (106) in FIG. 2 and FIG. 1C.)

Figure 1A:
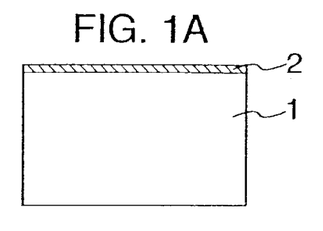
FIGS. 1A to 1J are sectional views showing a semiconductor device manufactured by the manufacturing method according to the first embodiment of the present invention.
Figure 1B:
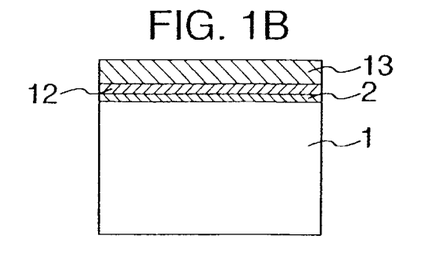
Figure 1C:
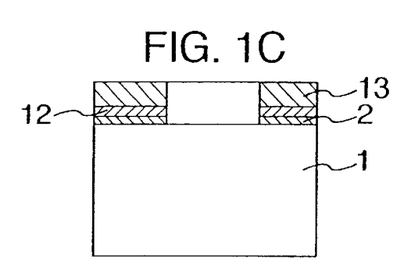
Figure 1D:
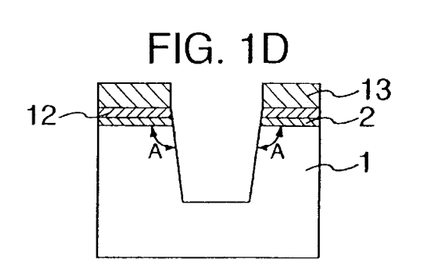
Figure 1E:
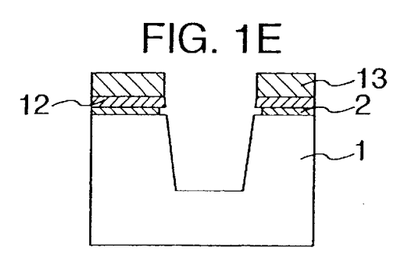
Figure 2:
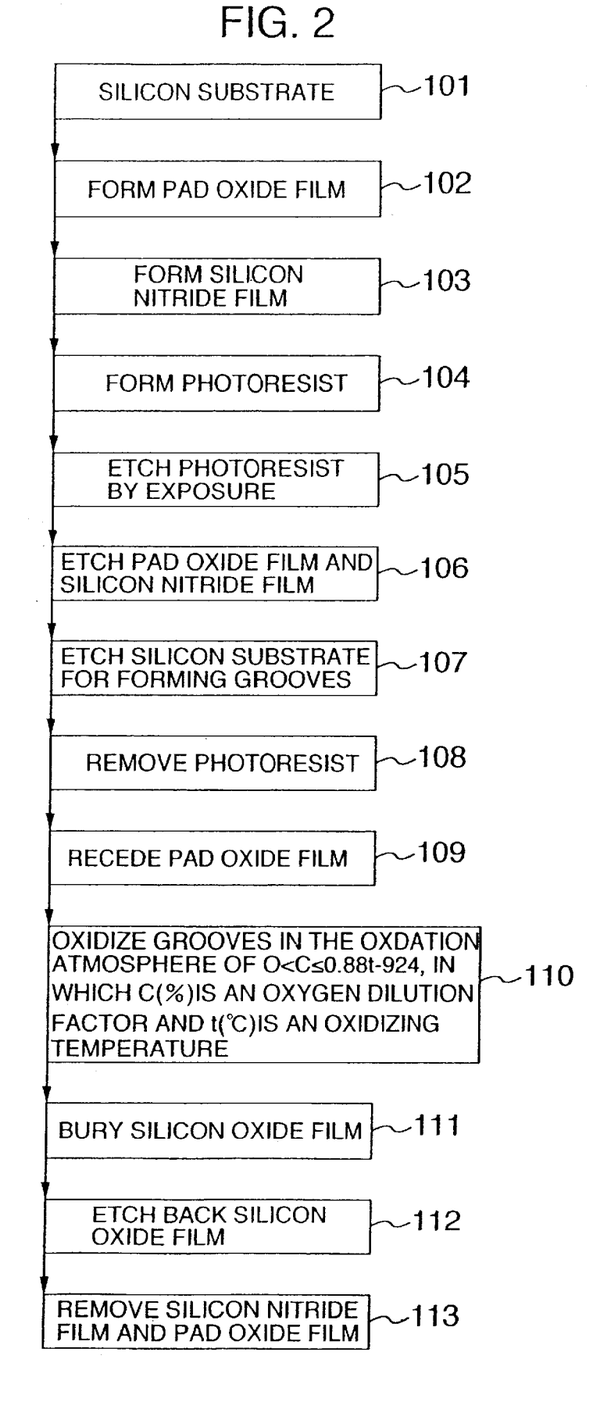
FIG. 2 is a flowchart showing a manufacturing process according to the first embodiment of the present invention.

(5) A shallow groove is formed to keep a side wall of the silicon substrate 1 at a given angle (for example, an angle of the A portion of FIG. 1D is in the range of 90 to 110 degrees.) against the silicon substrate 1. (Refer to process (107) in FIG. 2 and FIG. 1D.)

(6) A part of the photoresist 13 is removed. Then, the pad oxide film 2 is receded. (Refer to processes (108) and (109) in FIG. 2 and FIG. 1E.)

Figure 1F:
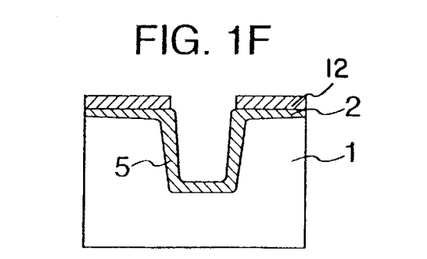
Figure 1G:
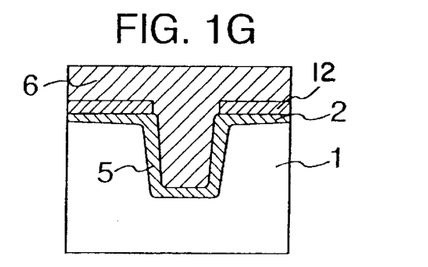
Figure 1H:
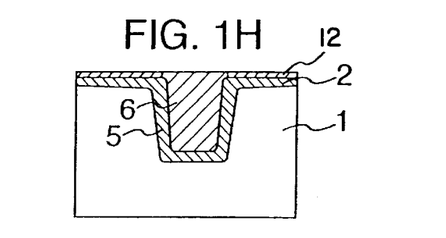

(7) In the case that the oxidizing temperature is t (° C.) and the oxygen partial pressure ratio is C (%) in the dry oxidation atmosphere (H2/O2≈0, that is, a hydrogen density in the oxidation atmosphere is 6 ppm or lower), the surface of the silicon substrate 1 is thermally oxidized to a depth of about 10 nm in the range of the partial pressure ratio C indicated by the following expression (1) and then a thermal oxide film 5 is formed on the groove. (Refer to process (110) and FIG. 1F.)

$$0 < C \leq 0.88t - 924 \quad (1)$$

(8) A silicon oxide film or the like is deposited and buried as an insulating film (hereinafter called a buried insulating film 6) by using the chemical vapor deposition (CVD) method, the sputtering method or the like. Since the silicon oxide film or the like produced by the CVD method, the sputtering method or the like is generally rough, after the buried insulating film 6 is deposited, for making the film compact, the silicon substrate 1 may be oxidized in the anneal or the oxidation atmosphere of about 1000 to 1100° C. (Refer to process (111) in FIG. 2 and FIG. 1G.)

(9) The buried insulating film 6 is etched back by using the chemical mechanical polish (CMP) method or the dry etching method. In this case, the silicon nitride film 12 used as the oxidation inhibition film is served as an etching stopper, which serves to prevent the silicon substrate 1 under the silicon nitride film 12 from being etched. (Refer to process (112) in FIG. 2 and FIG. 1H.)

Figure 1I:
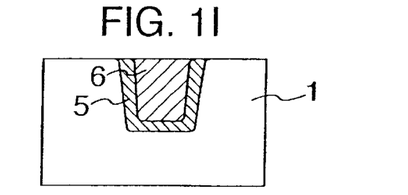
Figure 1J:
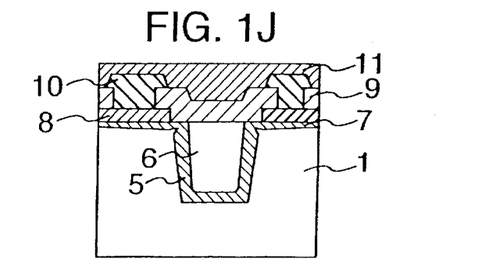

(10) The groove-buried structure is completed by removing the silicon nitride film 12 and the pad oxide film 2. (Refer to process (113 in FIG. 2 and FIG. 1I.) Then, the semiconductor device is completed by forming the transistor structure, for example, by forming a gate oxide film 7 and a gate electrode film 8, injecting impurities therein, forming a multi-layered wiring structure having wires 10 and interlayered insulating films 11, and forming a surface protective film (FIG. 1I).

In turn, the function and the effect of the first embodiment of the invention will be described with reference to FIGS. 3 and 4. The most important respect in the first embodiment of the invention is that for each temperature of the step (7), the oxygen partial pressure ratio C is defined as the range indicated in the foregoing expression (1).

Next, the pressure dividing effect in the oxidation atmosphere will be described with reference to FIGS. 3 and 4.

Figure 3:
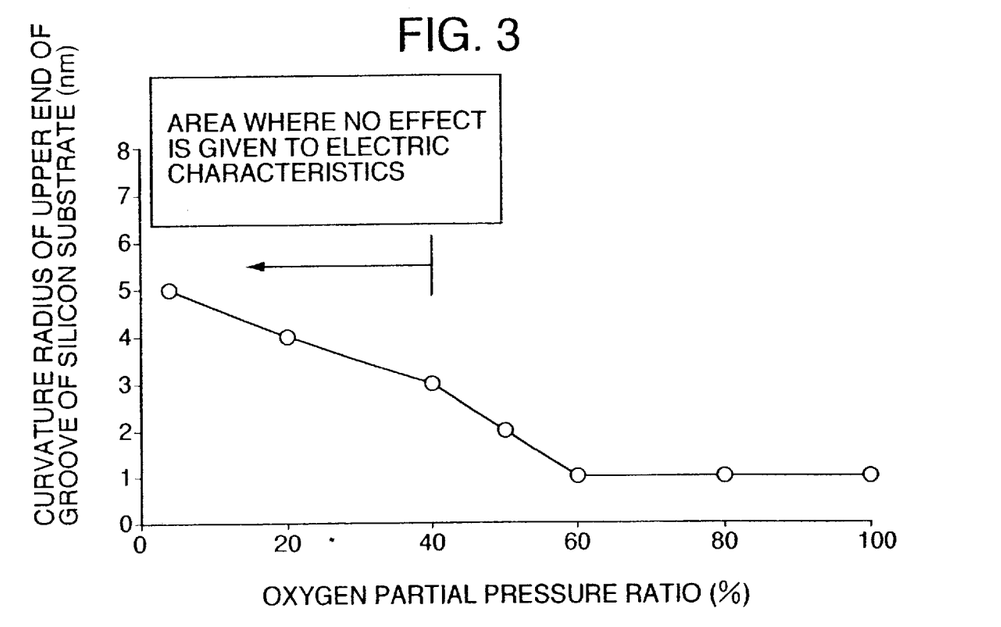
FIG. 3 is an explanatory graph showing a function and an effect of the first embodiment of the present invention.

FIG. 3 shows the simulated result of the change of a curvature radius around the upper end of the groove on the side of the substrate 1 by changing the oxygen partial pressure ratio C in the atmosphere in the oxidation of 10 nm, the recession of 10 nm of the pad oxide film 2, and the oxidizing temperature of 1100° C. In FIG. 3, an axis of abscissa denotes an oxygen partial pressure ratio and an axis of ordinance denotes a curvature radius on the upper end of the groove of the silicon substrate 1.

It is understood from FIG. 3 that at the temperature of 1100° C., if the partial pressure ratio C is 40% or less, the curvature radius of the corner is 3 nm or more, which does not cuase any defect.

The reason why the curvature radius is made greater with reduction of the partial pressure ratio C will be described as follows.

The cubical expansion in oxidation appearing on the side wall of the groove collides with the cubical expansion in oxidation appearing on the surface of the silicon substrate 1. Hence, the collision results in forming a high field of compressive stress. If the compressive stress takes place in the oxide film, the oxidation growth is inhibited, so that the oxidation rate on the upper end of the groove is lower than that on the other portion. It means that the upper end of the groove is formed to be acute.

The oxide film becomes viscous at high temperature. The oxidation at high temperature and for long time results in alleviating the stress on the effect of the viscosity. The reduction of the partial pressure ratio C of oxygen makes the oxidation rate slower. Hence, the compressive stress caused on the upper end of the groove is alleviated so that a curvature may be formed on the upper end of the groove.

The analysis by the similar method to that of FIG. 3 is executed at the temperatures of 1050 and 1150° C. As a result, the values shown in FIG. 4 indicate the proper partial pressure ratio C at which the curvature radius of the corner does not cause any defect, concretely, 3 nm or more. The right-hand area from the line L of FIG. 4 (indicated by oblique lines) is an area in which the curvature radius of the corner does not cause any defect, that is, 3 nm or more.

Figure 4:
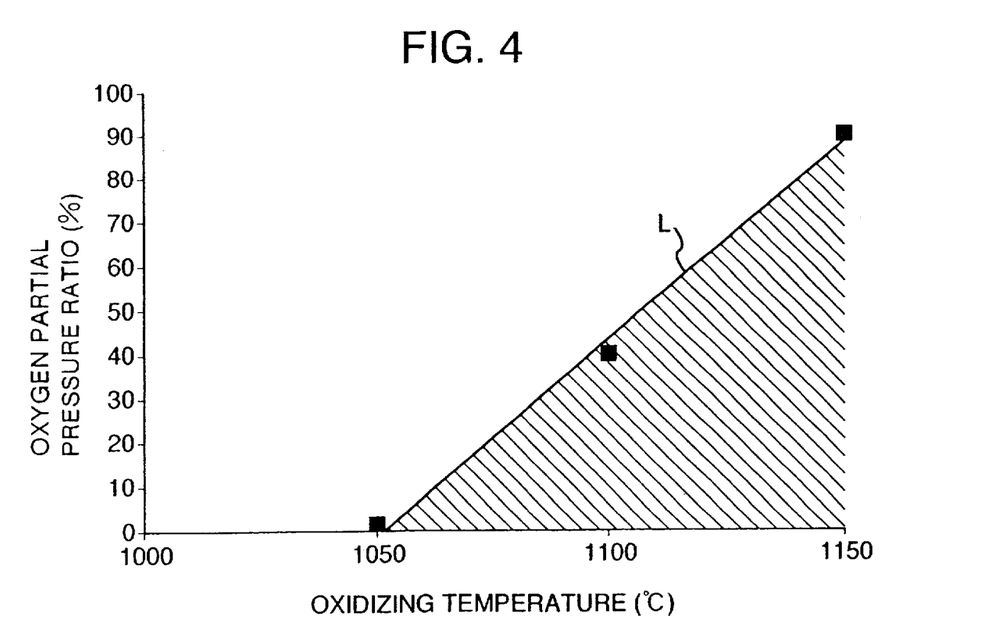
FIG. 4 is an explanatory graph showing a function and an effect of the first embodiment of the present invention.

It is understood from FIG. 4 that the shape is improved even at a smaller partial pressure ratio if the temperature is made higher. The points of the proper partial pressure ratios C are approximated by the line L, the gradient of which is as follows.

$$C=0.88t-924 \quad (2)$$

wherein C denotes an oxygen partial pressure ratio (%) and t denotes an oxidizing temperature (° C.). It means that the shape may be improved by setting the oxygen partial pressure ratio C to a lower range than the line L.

Further, no oxidation is done if the oxygen partial pressure ratio C is 0 or more. Hence, it is understood from the expression (2) that the oxidizing temperature is 1050° C. or more.

As described above, according to the first embodiment of the invention, the method of manufacturing a semiconductor device and the semiconductor device manufactured by the method are realized in which no stepped portion is formed and a curvature is reliably formed on the upper end of the groove even if the oxidation is small (about 10 nm). Hence, the curvature radius around the upper end of the substrate in the groove isolation structure is far larger than 3 nm. It serves to prevent increase of leak current or lowering of awithstand characteristic of a transistor caused on the concentration of an electric field around the upper end of the gate electrode film, thereby improving electric reliability of the transistor.

Figure 5:
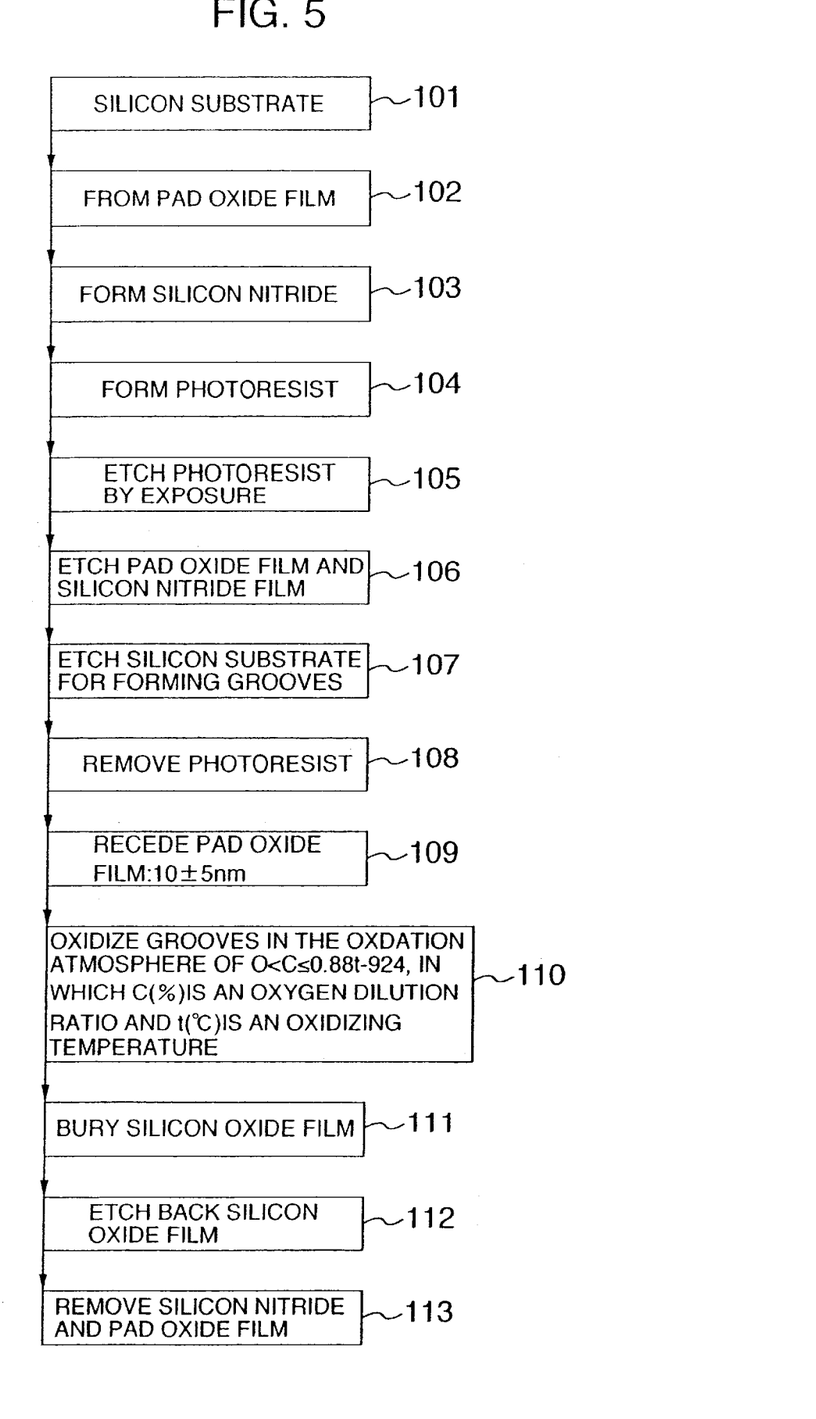
FIG. 5 is a flowchart showing a manufacturing process according to a second embodiment of the present invention.

In turn, the description will be oriented to a method of manufacturing a semiconductor device according to a second embodiment of the present invention with reference to FIGS. 1 and 5.

The method (flowchart) of manufacturing a semiconductor device according to a second embodiment of the invention shown in FIG. 5 corresponds to the manufacturing method of the first embodiment in which the step (6) is changed. As compared with the first embodiment, the semiconductor device manufactured with the second embodiment is made substantially invariable. Hence, the sections of the semiconductor device to be manufactured by the second embodiment are substantially same as those shown in FIG. 1. The steps (1) to (10) of the second embodiment will be described with reference to the flowchart of FIG. 5.

(1) A pad oxide film 2 having a thickness of about 10 nm is formed by thermally oxidizing the surface of the silicon substrate 1. (Refer to theprocesses (101) and (102) shown in FIG. 5 and FIG. 1A.)

(2) A silicon nitride film 12 is deposited on the pad oxide film 2 so that the film 12 has a thickness of about 200 nm. This silicon nitride film 12 is served as an oxidation inhibition film used in forming an element isolation thermal oxide film 5. (Refer to the process (103) in FIG. 5.)

(3) A photoresist 13 is formed on the silicon nitride film 12. (Refer to the process (104) shown in FIG. 5 and FIG. 1B.)

(4) After removing the photoresist 13 on a target area by using the ordinary exposure method, the silicon nitride film 12 and the pad oxide film 2 are removed. (Refer to the processes (105) and (106) in FIGS. 5 and 1C.)

(5) A shallow groove is formed to have a given angle (for example, an angle of an A portion in FIG. 1D is in a range from 90 to 110 degrees) between the side wall of the silicon substrate 1 and the silicon substrate 1 with the silicon nitride film 12 as a mask. (Refer to the process (107) in FIG. 5 and FIG. 1D.)

(6) After removing part of the photoresist 13, the pad oxide film 2 is receded from the upper end of the groove of the semiconductor substrate by the range of 10±5 nm. (Refer to the processes (108) and (109) in FIG. 5 and FIG. 1E.)

(7) In a case that the oxidizing temperature is t (° C.) and the oxygen partial pressure ratio is C (%) in the dry oxidizing atmosphere ($H_2/O_2 \approx 0$, that is, the hydrogen density in the dry oxidizing atmosphere is about 6 ppm or lower), the thermal oxidation is performed to the depth of about 10 nm of the surface of the silicon substrate 1 in the range indicated by the foregoing expression (1) for forming a thermal oxide film 5 on the groove portion. (Refer to the processes (110) in FIG. 5 and FIG. 1F.)

(8) An insulating film such as a silicon oxide film is deposited and buried by the CVD method or the sputtering method. Since the silicon oxide film produced by the CVD method or the sputtering method is generally rough, for making the film compact, after the buried insulating film 6 is deposited, the silicon substrate 1 may be oxidized in the anneal or the oxidizing atmosphere of about 1100° C. (Refer to the process (111) in FIG. 5 and FIG. 1G.)

(9) The buried insulating film 6 is etched back by using the CMP method or the dry etching method. In this case, the silicon nitride film 12 used for the oxidation inhibition film is served as an etching stopper and has a function of preventing the silicon substrate 1 under the silicon nitride film 12 from being etched. (Refer to the process (112) in FIG. 5 and FIG. 1H.)

(10) Then, the silicon nitride film 12 and the pad oxide film 2 are removed. This is the completion of the groove-buried structure. (Refer to the process (113) in FIG. 5 and FIG. 1I.) Then, the operations required for manufacturing the transistor structure, such as formation of the gate oxide film 7 and the gate electrode film 8, injection of impurities, formation of a multi-layered wiring structure such as a wire 10 and an inter-layered insulating film 11, and formation of a surface protecting film, are executedforcompletingthesemiconductordevice. (Referto FIG. 1J.)

The different respect of the second embodiment from the prior art is that the recession of the pad oxide film is defined at the step (6).

Figure 6A:
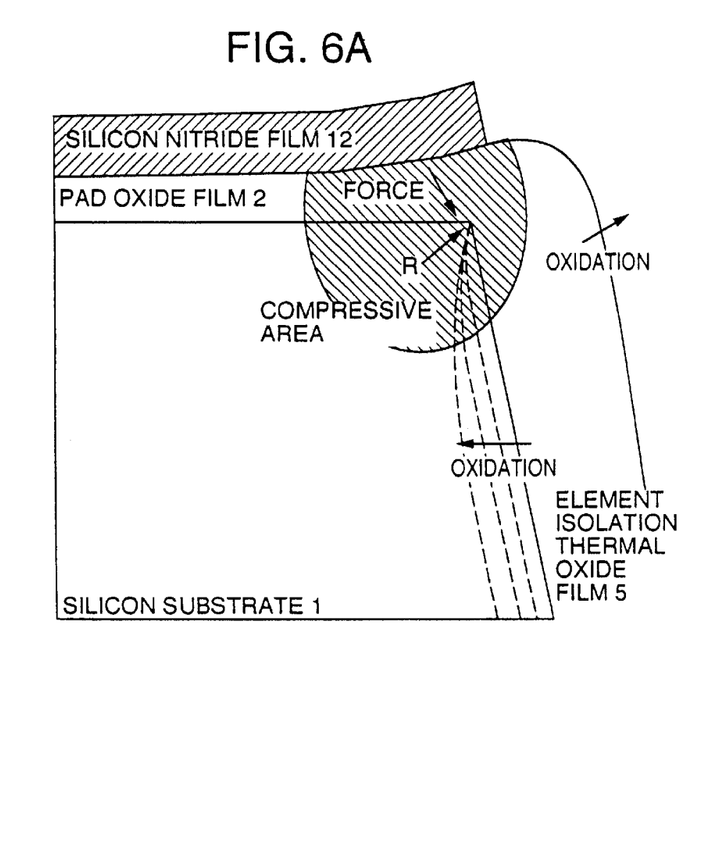
FIGS. 6A and 6B are explanatory views showing a function and an effect of the second embodiment of the present invention.
Figure 6B:
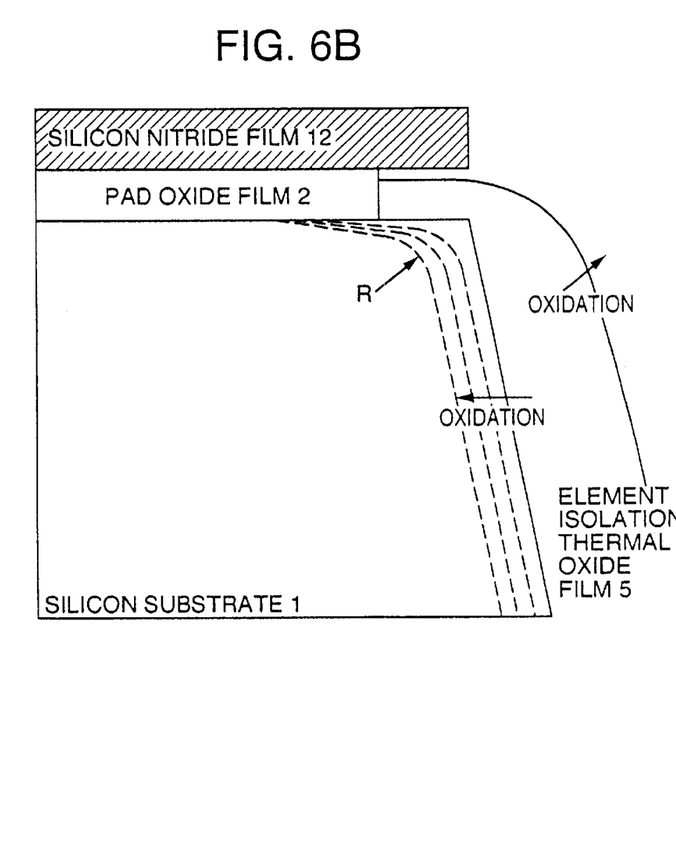

In turn, the description will be oriented to the effect of receding the pad oxide film with reference to FIG. 6.

In oxidizing the groove, the oxide film is grown as its cube is being double-expanded between the silicon nitride film 12 and the silicon substrate 1. If the recession of the pad oxide film 2 is zero, the cubical expansion serves to lift up the end portion of the silicon nitride film 12 (upwardly of FIG. 6). As a result, the silicon nitride film 12 is warped around in a concave manner. The opposite force caused by the warp of the silicon nitride film 12 brings about compressive stress between the oxide film (containing part of the pad oxide film 2) under the silicon nitride film 12 and the silicon substrate 1 (FIG. 6A).

When the compressive stress appears in the oxide film, the diffusion of an oxide material, that is, the progress of the oxidative reaction is inhibited, which remarkably lowers the oxidizing speed at the upper end of the groove. On the other hand, on the sidewall of the groove, the oxidation is not relatively suppressed and thus progressed on the side wall, because the growing direction of the oxide film (toward the vertical of the side) is not constrained and no inhibitor to the cubical expansion of the oxide film being grown is contained on the side wall.

Around the upper end of the groove of the silicon substrate 1, the shape of the substrate is being acute with the progress of oxidation as shown by a broken line of FIG. 6A. However, the recession of the pad oxide film 2 results in making the part of the end of the groove of the silicon substrate 1 exposed (FIG. 6B) On the exposed portion, the grown oxide film does not come into contact with the upper silicon nitride film 12 at the initial oxidation stage. Further, no substantial compressive stress is caused by the warp of the silicon nitride film 12 as described with reference to FIG. 6A. Hence, the oxidation is progressed without inhibition. As a result, the upper end portion of the groove is rounded and the curvature radius is made larger.

Further, the recession of the pad oxide film 2 leads to formation of the exposed area of the silicon substrate 1 and the non-exposed area thereof around the end portion of the receded pad oxide film 2. In the exposed area, the diffusion of oxygen is fast, so that oxidation is progressed fast, while in the non-exposed area, it is not progressed so fast. This speed difference results in forming a step on the end portion of the pad oxide film 2.

The upper end of the groove of the silicon substrate 1 comes into contact with oxygen on two planes, so that oxidation is progressed fast. If the recession of the pad oxide film 2 is in the range of 10±5 nm, since the end of the pad oxide film 2 comes closer to the upper end of the groove of the silicon substrate 1, the effects thereof are overlapped so that no step is caused. If the range is farther, the end of the pad oxide film 2 is farther from the upper end of the groove of the silicon substrate 1, so that an unfavorable step may be formed.

On the foregoing grounds, like the first embodiment, according to the second embodiment, the method for manufacturing a semiconductor device and the semiconductor device manufactured by the method may be realized in which a curvature radius may be reliably formed on the upper end of the groove without forming the step and even if the oxidation is small (about 10 nm). Further, the curvature radius around the upper end on the substrate side of the groove isolation structure may be far larger than 3 nm. Moreover, the recession of the pad oxide film is defined in the range of 10±5 nm. Therefore, no step is formed and the increase of leak current and lowering of the withstand characteristic of a transistor resulting from concentration of an electric field near the end of the gate electrode film may be prevented, thereby improving the electric reliability of the transistor.

According to the present invention, the method for manufacturing a semiconductor device and the semiconductor device manufactured by the method may be realized in which a curvature is reliably formed on the upper end of the groove without forming any step and even if the oxidation is small (about 10 nm).

What is claimed is:

1. A semiconductor device manufactured by the steps of forming a pad oxide film on a circuit forming surface of a semiconductor substrate; forming an oxidation inhibition film on said pad oxide film; forming grooves in said semiconductor substrate with said oxide inhibition film as a mask; receding said pad oxide film; oxidizing each of said grooves formed in said semiconductor substrate in a range of $0 < C \leq 0.88t - 924$ in which oxidizing atmosphere is dry oxidation ($H_2/O_2 \approx 0$), an oxygen partial pressure in the air corresponding to the oxygen partial pressure ratio is C (%), and oxidizing temperature is t (° C.), t being equal to or higher than 1050° C.; burying an insulating film inside of said grooves; removing said oxidation inhibition film formed on the circuit forming surface of said semiconductor substrate; and removing said pad oxide film formed on the circuit forming surface of said semiconductor substrate.

2. A semiconductor device as claimed in claim 1, wherein said pad oxide film is receded in a range of 10±5 nm from side wall portions of said grooves of said semiconductor substrate.

3. A semiconductor device as claimed in claim 1, wherein, in the step of burying the insulating film, the insulating film is also formed on the oxidation inhibition film, and wherein the steps of manufacturing the semiconductor device also include removing the insulating film formed on the oxidation inhibition film.

* * * * *

UNITED STATES PATENT AND TRADEMARK OFFICE
CERTIFICATE OF CORRECTION

PATENT NO.   : 6,326,255 B1
DATED        : December 4, 2001
INVENTOR(S)  : Norio Ishitsuka et al.

It is certified that error appears in the above-identified patent and that said Letters Patent is hereby corrected as shown below:

<u>Title page,</u>
Item [62], Related U.S. Application Data, replace "Division of application No. 09/434,308, filed on Nov. 5, 1999" with -- Division of application No. 09/434,308, filed Nov. 5, 1999, now Pat. No. 6,284,625 --.

Signed and Sealed this

Ninth Day of April, 2002

Attest:

JAMES E. ROGAN
Attesting Officer
Director of the United States Patent and Trademark Office